(12) United States Patent
Lin

(10) Patent No.: US 12,405,438 B2
(45) Date of Patent: Sep. 2, 2025

(54) LENS DEVICE

(71) Applicants: Sintai Optical (Shenzhen) Co., Ltd., ShenZhen (CN); Asia Optical Co., Inc., Taichung (TW)

(72) Inventor: Guo-Quan Lin, ShenZhen (CN)

(73) Assignees: SINTAI OPTICAL (SHENZHEN) CO., LTD., Shenzhen (CN); ASIA OPTICAL CO., INC., Taichung (TW)

( * ) Notice: Subject to any disclaimer, the term of this patent is extended or adjusted under 35 U.S.C. 154(b) by 591 days.

(21) Appl. No.: 17/846,230

(22) Filed: Jun. 22, 2022

(65) Prior Publication Data

US 2023/0018568 A1    Jan. 19, 2023

(30) Foreign Application Priority Data

Jul. 16, 2021 (CN) .......................... 202110805132.1

(51) Int. Cl.
  *G02B 7/02* (2021.01)
  *H05K 1/18* (2006.01)

(52) U.S. Cl.
  CPC ............ *G02B 7/025* (2013.01); *G02B 7/022* (2013.01); *H05K 1/181* (2013.01); *H05K 1/189* (2013.01); *H05K 2201/10121* (2013.01)

(58) Field of Classification Search
  None
  See application file for complete search history.

(56) References Cited

U.S. PATENT DOCUMENTS

| 2017/0261722 A1* | 9/2017 | Miyoshi | G02B 7/10 |
| 2018/0231734 A1* | 8/2018 | Ochi | G02B 7/021 |
| 2020/0186686 A1* | 6/2020 | Lin | G02B 7/026 |

FOREIGN PATENT DOCUMENTS

CN    110058376 A    *    7/2019    ........... G02B 25/001

* cited by examiner

*Primary Examiner* — Shan Liu
(74) *Attorney, Agent, or Firm* — McClure, Qualey & Rodack, LLP

(57) ABSTRACT

A lens device includes a base, a guiding unit, a plurality of lens groups and a flexible printed circuit board. The guiding unit is disposed on the base in a first direction. The plurality of lens groups are disposed on the base and include at least one movable lens group that is movable along the guiding unit. The flexible printed circuit board is fixed to the movable printed circuit board, and bent in the first direction to form a bent portion. The guiding unit is disposed in contact with a top of the bent portion of the flexible printed circuit board.

19 Claims, 7 Drawing Sheets

LENS DEVICE

BACKGROUND OF THE INVENTION

Field of the Invention

The invention relates to a lens device.

Description of the Related Art

FIG. 1A is a perspective view of a lens device 10 of the prior art. FIG. 1B is a front view of the lens device 10 of the prior art. As shown in FIGS. 1A and 1B, the lens device 10 includes a prism module 11, a lens module 12 and an image-forming module (not shown), all of which are disposed in a base 13 and are sequentially arranged in a first direction X.

The lens module 12 includes a first lens group 12a, a second lens group 12b, a third lens group 12c and a fourth lens group 12d. The second lens group 12b and the third lens group 12c can be moved along an optical axis in the first direction X to perform zooming operation. Further, two flexible printed circuit boards are respectively connected to the second lens group 12b and the third lens group 12c, are bent, and are electrically connected to a circuit board disposed on the bottom of the base 13. In FIGS. 1A and 1B, the directions in which the two flexible printed circuit boards are bent are represented by arrows.

FIG. 2 is a schematic view showing the structure of a lens group of the lens module of the prior art, wherein the second lens group is taken as an example for descriptions. The second lens group 12b includes a lens frame 12b-1 and at least one lens 12b-2 disposed in the lens frame 12b-1. The outer circumferential surface of the lens 12b-2 includes two curved portions 12b-21 and two straight portions 12b-22. The curved portions 12b-21 are opposite to each other in a second direction Y. The straight portions 12b-22 are connected between the curved portions 12b-21 and are opposite to each other in a third direction Z. The inner surface of the lens frame 12b-1 fits the outer circumferential surface of the lens 12b-2 in shape. Further, the inner surface of the lens frame 12b-1 fits the curved portions 12b-21 of the outer circumferential surface of the lens 12b-2 with interference so that the lens 12b-2 is fixed to the interior of the lens frame 12b-1.

However, the lens device has the following drawbacks: the second lens group 12b and the third lens group 12c are movable along the optical axis in the first direction X, and the corresponding flexible printed circuit boards are also movable along with the second lens group 12b and the third lens group 12c. During the movement, where the flexible printed circuit boards are bent is not under control, and forces generated accordingly affect the movement of the corresponding lens groups. Further, in the limit position, the r-value of the bent flexible printed circuit board is rather small. Thus, the flexible printed circuit board is susceptible to breakage after long-term use. Further, the curved portions of the outer circumferential surface of the lens fit the lens frame with interference. That is, the curved portions of the outer circumferential surface of the lens sustain forces so that the lens sustains a force in the second direction Y. Thus, during the test of reliability or under the severe conditions of high temperature and high humidity, the lens is susceptible to deformation because of the bias force.

BRIEF SUMMARY OF THE INVENTION

The invention provides a solution to address the described drawbacks. The flexible printed circuit board of the lens device of the invention has improved bending-resistance ability.

The lens device in accordance with an exemplary embodiment of the invention includes a base, a guiding unit, a plurality of lens groups and a flexible printed circuit board. The guiding unit is disposed on the base in a first direction. The plurality of lens groups are disposed on the base and include at least one movable lens group that is movable along the guiding unit. The flexible printed circuit board is fixed to the movable printed circuit board, and bent in the first direction to form a bent portion. The guiding unit is disposed in contact with a top of the bent portion of the flexible printed circuit board.

In another exemplary embodiment, the flexible printed circuit board is extended out of the movable lens group.

In yet another exemplary embodiment, the guiding unit includes a guiding-and-positioning element disposed in contact with the top of the bent portion of the flexible printed circuit board.

In another exemplary embodiment, the guiding unit further includes a lens-group-guiding element, and the lens-group-guiding element and the guiding-and-positioning element are disposed on both sides of the movable lens group.

In yet another exemplary embodiment, the movable lens group includes a lens frame and a lens fixed to the lens frame, the lens frame includes an extending portion, and the extending portion includes an opening or a hole which the guiding unit fits.

In another exemplary embodiment, the extending portion includes a bottom and an inclined surface formed on the bottom, and the inclined surface is extended toward the guiding unit.

In yet another exemplary embodiment, the flexible printed circuit board is extended out of the bottom of the extending portion, along the inclined surface, and in contact with the guiding unit.

In another exemplary embodiment, the lens device further includes a driving device configured to drive the movable lens group to move in the first direction.

In yet another exemplary embodiment, the driving device includes a magnet fixed to the base, and a coil fixed to the movable lens group.

In another exemplary embodiment, the driving device includes a magnet fixed to the movable lens group, and a coil fixed to the base.

In yet another exemplary embodiment, the lens device further includes a circuit board disposed on a bottom of the base. The flexible printed circuit board includes a first end electrically connected to the coil. The flexible printed circuit board is extended along a bottom of the movable lens group and is fixed thereto. The flexible printed circuit board is further extended under the guiding unit and out therefrom to form the bent portion. The flexible printed circuit board further includes a second end electrically connected to the circuit board.

In another exemplary embodiment, the base includes a first side wall, a second side wall, a third side wall and a fourth side wall. The first side wall and the second side wall are disposed opposite to each other and perpendicular to the first direction. The third side wall and the fourth side wall are disposed opposite to each other and perpendicular to a second direction. The second direction is perpendicular to the first direction. The guiding unit including a guiding-andpositioning element disposed in contact with the top of the bent portion of the flexible printed circuit board.

In yet another exemplary embodiment, the guiding-and-positioning element is a guiding rod connected between the first side wall and the second side wall.

In another exemplary embodiment, the guiding-and-positioning element is an elongated protrusion disposed on the third side wall or the fourth side wall.

In yet another exemplary embodiment, the plurality of lens groups further includes a lens frame and a lens disposed in the lens frame. The lens includes an outer circumferential surface. The outer circumferential surface includes first outer circumferential portions disposed opposite to each other in a second direction, and second outer circumferential portions are connected between the first outer circumferential portions and disposed opposite to each other in a third direction. The first, second and third directions are perpendicular to each other. The second outer circumferential portions are in parallel.

In another exemplary embodiment, the lens frame includes an adhesive-applying groove, and the adhesive-applying groove is penetrated through the lens frame and corresponds to the second outer circumferential portions of the lens.

In yet another exemplary embodiment, the first outer circumferential portion is curved. The lens further includes an edge portion and a central effective-diameter portion. The adhesive-applying groove includes an end portion corresponding to the edge portion of the lens, and a curved portion corresponding to the central effective-diameter portion of the lens.

In another exemplary embodiment, the adhesive-applying groove is elongated.

In yet another exemplary embodiment, a shape of the adhesive-applying groove is similar to an outline of the outer circumferential surface of the lens projected onto the lens frame in the third direction. The adhesive-applying groove is smaller than the lens when observed in the third direction. At least one of the plurality of lens groups further includes a reinforcing sheet that fits the adhesive-applying groove.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The purpose, technical scheme and merits of the invention can be more fully understood by reading the subsequent detailed description and embodiments with references made to the accompanying drawings. However, it is understood that the subsequent detailed description and embodiments are only used for describing the invention. The invention is not limited thereto.

Figure 1A:
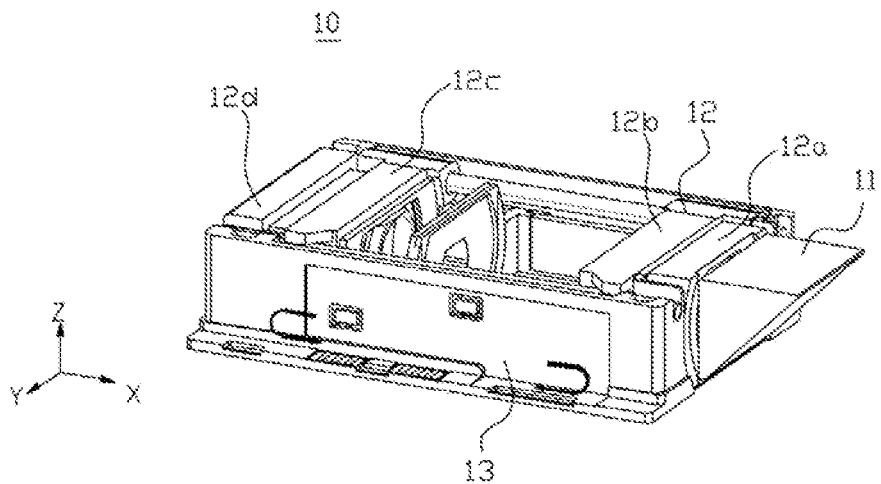
FIG. 1A is a perspective view of a lens device of the prior art.
Figure 1B:
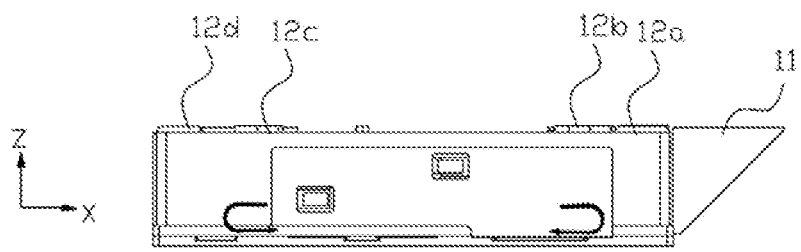
FIG. 1B is a front view of the lens device of the prior art.
Figure 2:
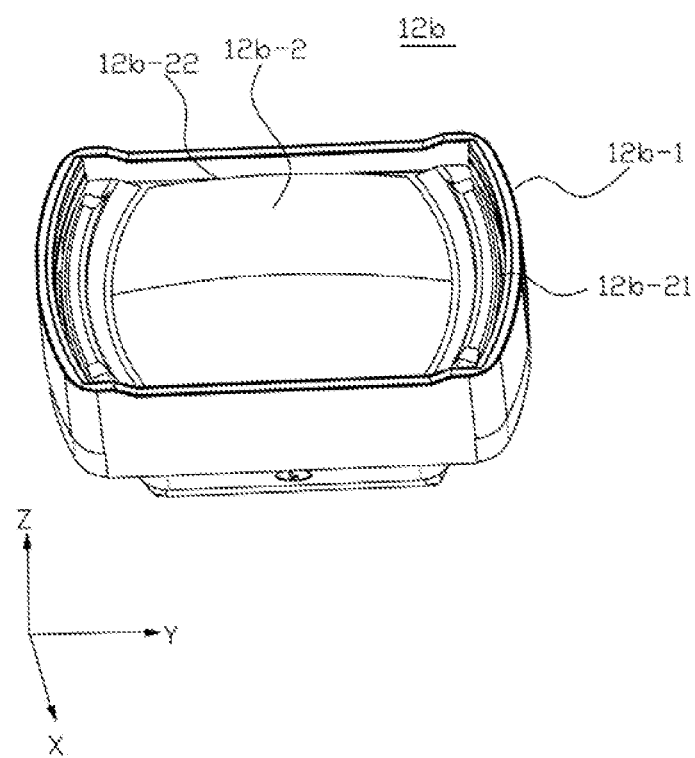
FIG. 2 is a schematic view showing the structure of a lens group of the lens module of the prior art.
Figure 3:
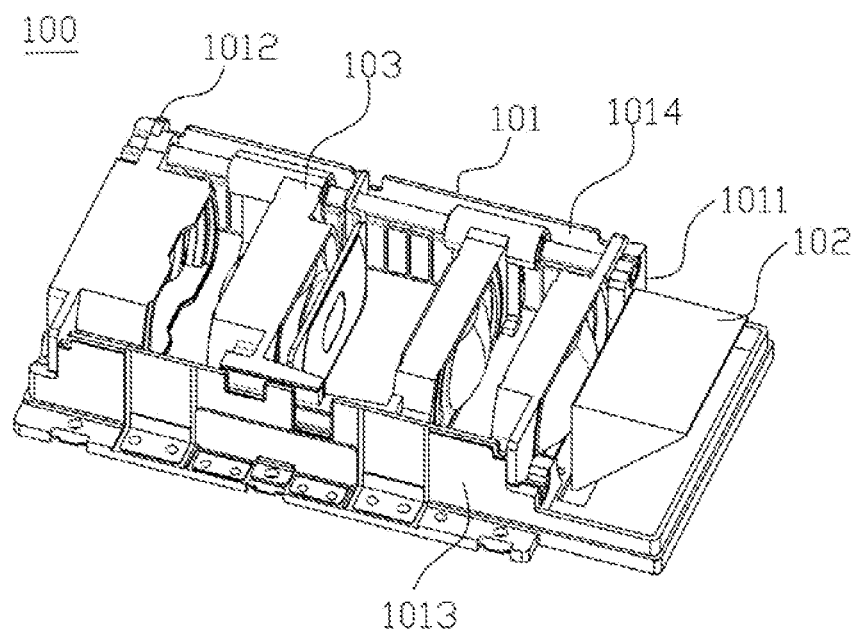
FIG. 3 is a perspective view of a lens device in accordance with an embodiment of the invention.
Figure 4:
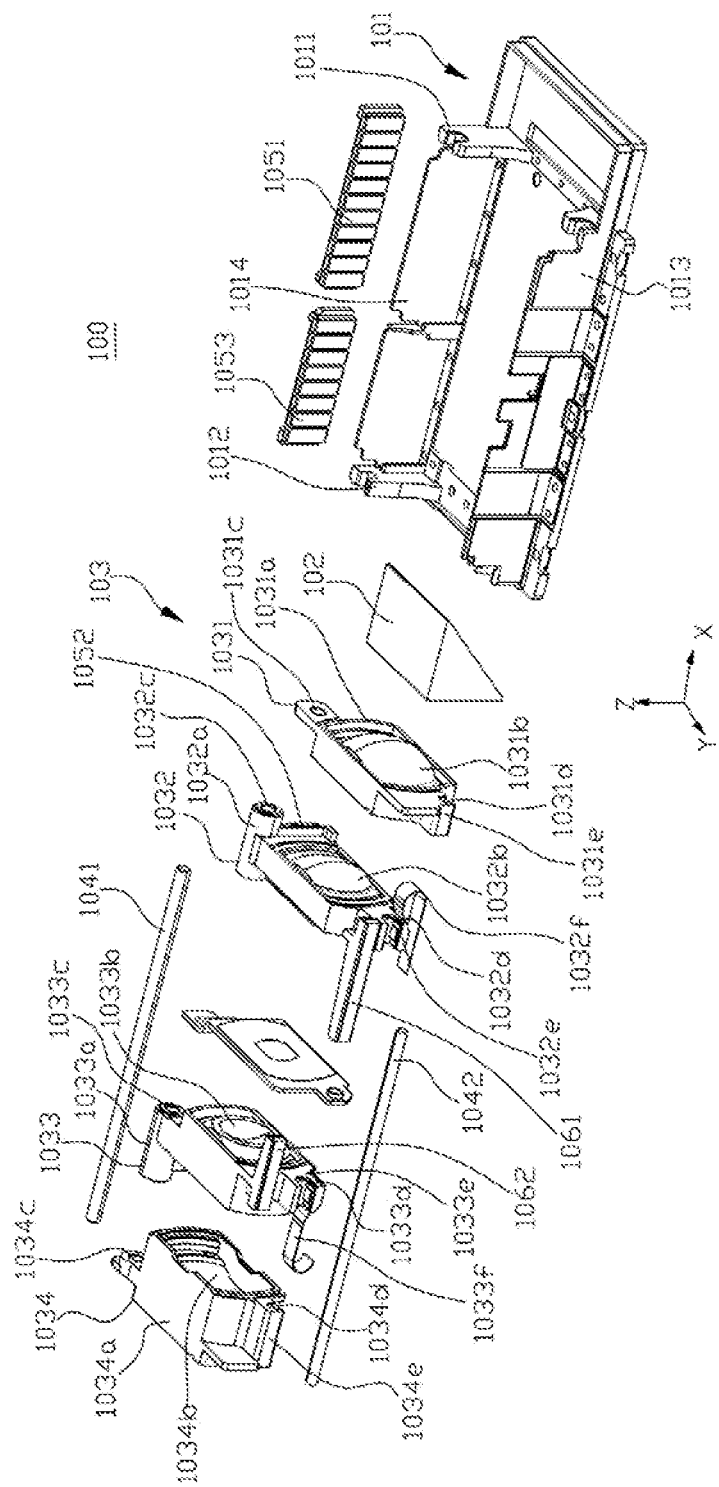
FIG. 4 is an exploded schematic view of the lens device in accordance with the embodiment of the invention.
Figure 5:
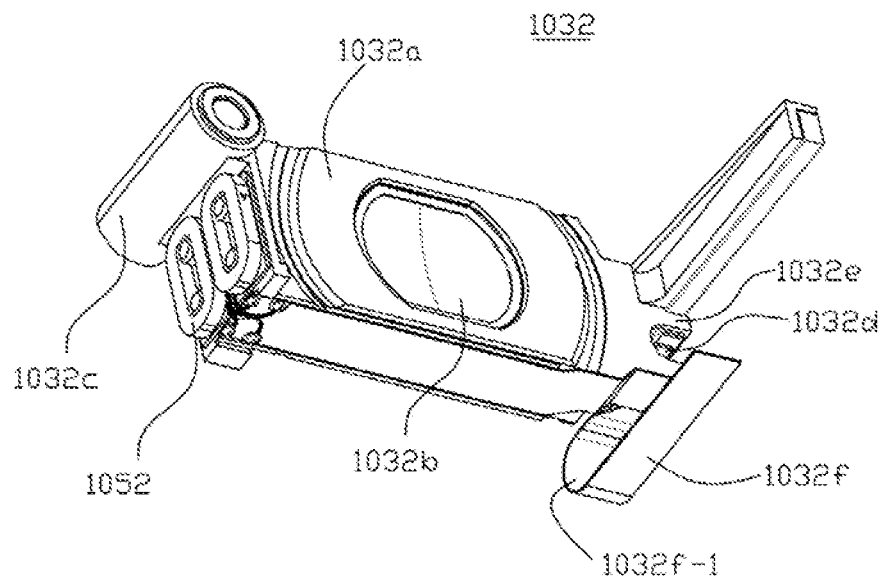
FIG. 5 is a schematic view showing the structure of a second lens group in accordance with the embodiment of the invention.
Figure 6:
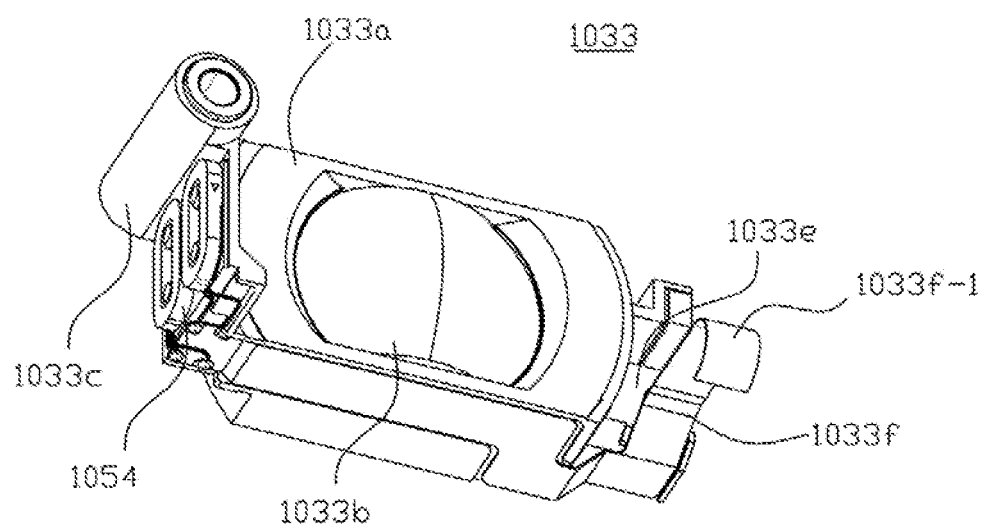
FIG. 6 is a schematic view showing the structure of a third lens group in accordance with the embodiment of the invention.

FIG. 3 is a perspective view of a lens device 100 in accordance with an embodiment of the invention. FIG. 4 is an exploded schematic view of the lens device 100 in accordance with the embodiment of the invention. FIG. 5 is a schematic view showing the structure of a second lens group 1032 in accordance with the embodiment of the invention. FIG. 6 is a schematic view showing the structure of a third lens group 1033 in accordance with the embodiment of the invention. As shown in FIGS. 3-6, the lens device 100 includes a base 101, a light path turning module 102, a lens module 103 and an image forming module (not shown). The light path turning module 102, the lens module 103 and the image forming module (not shown) are disposed in the base 101 and sequentially arranged in a first direction X. The lens module 103 has an optical axis extending in the first direction X.

The base 101 includes a first side wall 1011, a second side wall 1012, a third side wall 1013 and a fourth side wall 1014. The first side wall 1011 and the second side wall 1012 are disposed opposite to each other and perpendicular to the first direction X. The third side wall 1013 and the fourth side wall 1014 are disposed opposite to each other and perpendicular to a second direction Y. The first direction X is perpendicular to the second direction Y. The light path turning module 102, the lens module 103 and the image forming module (not shown) are disposed on the base 101 or in the base 101. The first side wall 1011 and the second side wall 1012 extend upwards in a third direction Z and are separated from each other.

The light path turning module 102 is configured to reflect the light coming from the third direction Z to propagate in the first direction X. Then, the light sequentially enters the lens module 103 and the image forming module, wherein the third direction Z is perpendicular to the first direction X and the second direction Y. A driving unit may be provided corresponding to the light path turning module 102 for driving the light path turning module 102 to rotate about an axis extending in the second direction Y, thereby adjusting the direction in which the light is reflected to the lens module 103. However, the invention is not limited thereto. The light path turning module 102 can be further rotated about axes and/or an axis extending in the third direction Z and/or the first direction X to perform optical image stabilization (OIS) operation.

In this embodiment, the light path turning module 102 is a prism. However, the invention is not limited thereto. The light path turning module 102 may be a prism or a reflective mirror. In a preferred embodiment, a reflective surface of the prism or reflective mirror is provided with a metal layer formed from, for example, aluminum (AL) or silver (Ag). The method of forming the metal layer includes (but is not limited to) plating, printing, coating and so on. By arrangement of the metal layer, both the chromatic aberration and flare can be avoided when an image is formed. Therefore, the invention is capable of improving chromatic aberration, effectively focusing the point light source, and providing the lens assembly with good image-forming quality.

The lens module 103 includes a plurality of lens groups wherein at least one lens group is movable along the optical axis extending in the first direction X. Each lens group has a lens frame and one or more lenses fixed to the lens frame. In the embodiment depicted by figures, the lens module 103 includes four lens groups, wherein a first lens group 1031 includes a first lens frame 1031a and one or more first lenses 1031b disposed in the first lens frame 1031a, a second lens group 1032 includes a second lens frame 1032a and one or more second lenses 1032b disposed in the second lens frame 1032a, a third lens group 1033 includes a third lens frame 1033a and one or more third lenses 1033b disposed in the third lens frame 1033a, and a fourth lens group 1034 includes a fourth lens frame 1034a and one or more fourth lenses 1034b disposed in the fourth lens frame 1034a.

Figure 8A:
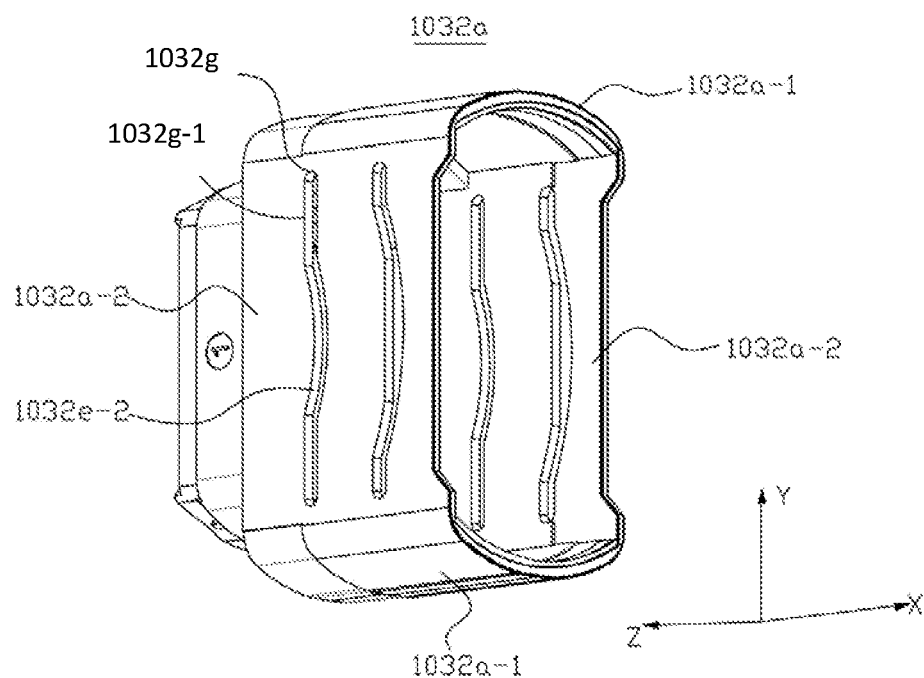
FIG. 8A is a schematic view showing the structure of the second lens frame of the second lens group in accordance with the embodiment of the invention.
Figure 8B:
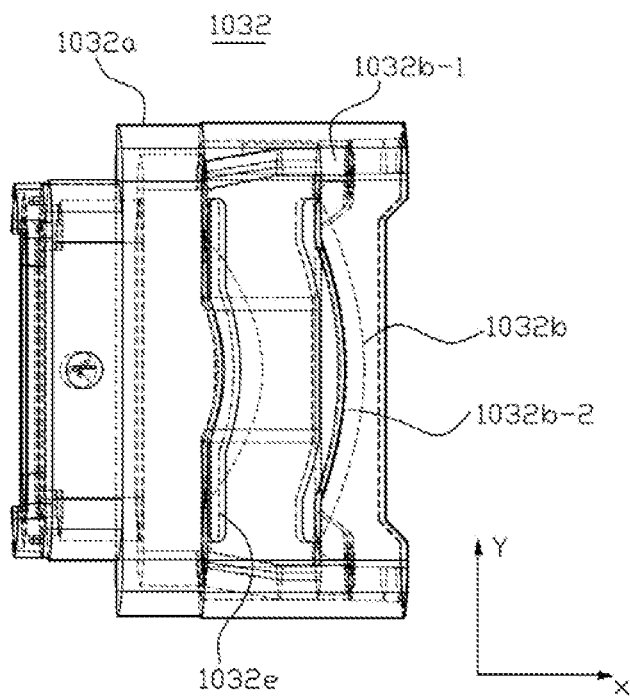
FIG. 8B is a top view of the second lens group in accordance with the embodiment of the invention.

FIG. 8A is a schematic view showing the structure of the second lens frame 1032a of the second lens group 1032 in accordance with the embodiment of the invention. FIG. 8B is a top view of the second lens group 1032 in accordance with the embodiment of the invention. It is understood that the second lens group 1032 is selected as an example for descriptions. However, the invention is not limited thereto. Other lens groups may have the same or similar structure as the second lens group 1032. As shown in FIGS. 8A and 8B, the second lens group 1032 includes a second lens frame 1032a and one or more second lenses 1032b disposed in the second lens frame 1032a. In detail, the second lens 1032b includes an edge portion 1032b-1 and a central effective-diameter portion 1032b-2. The outer circumferential surface of the edge portion 1032b-1 fits the second lens frame 1032a with interference, and the side surfaces of the second lens 1032b are configured to abut against the adjacent lenses. The second lens 1032b is formed by cutting an upper portion and a lower portion of a circular lens along planes in parallel to the first direction X and the second direction Y. The first direction X, the second direction Y and the third direction Z are perpendicular to each other.

The outer circumferential surface of the second lens 1032b includes first outer circumferential portions and second outer circumferential portions. The first outer circumferential portions are disposed opposite to each other in the second direction Y. The second outer circumferential portions are connected between the first outer circumferential portions and disposed opposite to each other in the third direction Z. The inner surfaces of the second lens frame 1032a matches the outer circumferential surfaces of the second lens 1032b in shape. The inner surface of the second lens frame 1032a includes first inner circumferential portions 1032a-1 and second inner circumferential portions 1032a-2. The first inner circumferential portions 1032a-1 are disposed opposite to each other in the second direction Y. The second inner circumferential portions 1032a-2 are connected between the first inner circumferential portions and disposed opposite to each other in the third direction Z. The first outer circumferential portions and the first inner circumferential portions 1032a-1 may be curved, for instance, in shape of a part of circular circumference. The second outer circumferential portions and the second inner circumferential portions 1032a-2 may be straight. That is, they are disposed in parallel and symmetrically.

The first outer circumferential portions of the second lens 1032b fit the first inner circumferential portions 1032a-1 of the second lens frame 1032a with interference. By such arrangement, the second lens 1032b is fixed to the interior of the second lens frame 1032a.

The second lens frame 1032a has an adhesive-applying groove 1032g. The adhesive-applying groove 1032g is penetrated from the outer surface of the second lens frame 1032a to the second inner circumferential portion 1032a-2 and corresponds to the second outer circumferential portion of the second lens 1032b. The adhesive-applying groove 1032g extending on the second inner circumferential portion 1032a-2 may be in shape of straight line, curved line or polyline. However, the invention is not limited thereto. In this embodiment depicted by figures, the adhesive-applying groove 1032g is elongated and therefore includes an end portion 1032g-1 corresponding to the edge portion 1032b-1 of the second lens 1032b and a curved portion 1032g-2 corresponding to the central effective-diameter portion 1032b-2 of the second lens 1032b. The end portion 1032g-1 may be in shape of straight line. The curved portion 1032g-2 may fit the surface of the second lens 1032b in shape. The number of the adhesive-applying groove 1032g may be plural.

In assembly, the second lens 1032b is fitted into the second lens frame 1032a and adhesive is applied to the adhesive-applying groove 1032g. After adhesive is cured, the second lens 1032b is fixed. The invention differs from the prior art in that adhesive is applied at the exterior of the second lens frame 1032a so that the adhesive-applying operation is convenient without any overflow of adhesive. Further, use of the adhesive can guarantee the reliability of connection between the second lens 1032b and the second lens frame 1032a, without requirements of much interference therebetween. That is, the force applied to the second lens 1032b by the second lens frame 1032a can be reduced. Further, a firm connection between the second lens 1032b and the second lens frame 1032a can maintain good strength and reliability of the lens device, even during the test of reliability or under the conditions of high temperature and high humidity.

Figure 9A:
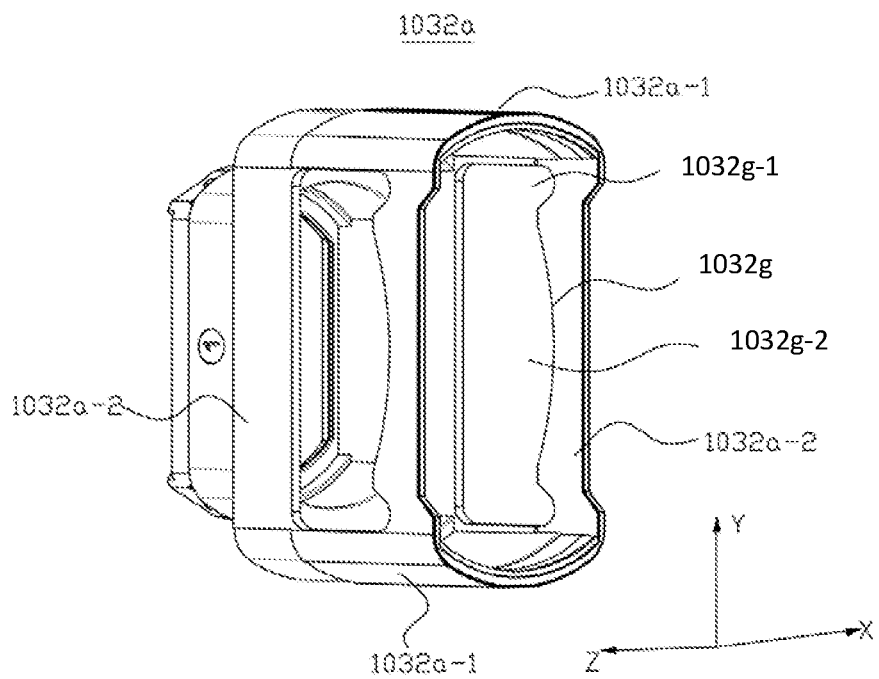
FIG. 9A is a schematic view showing the structure of the second lens frame of the second lens group in accordance with another embodiment of the invention.
Figure 9B:
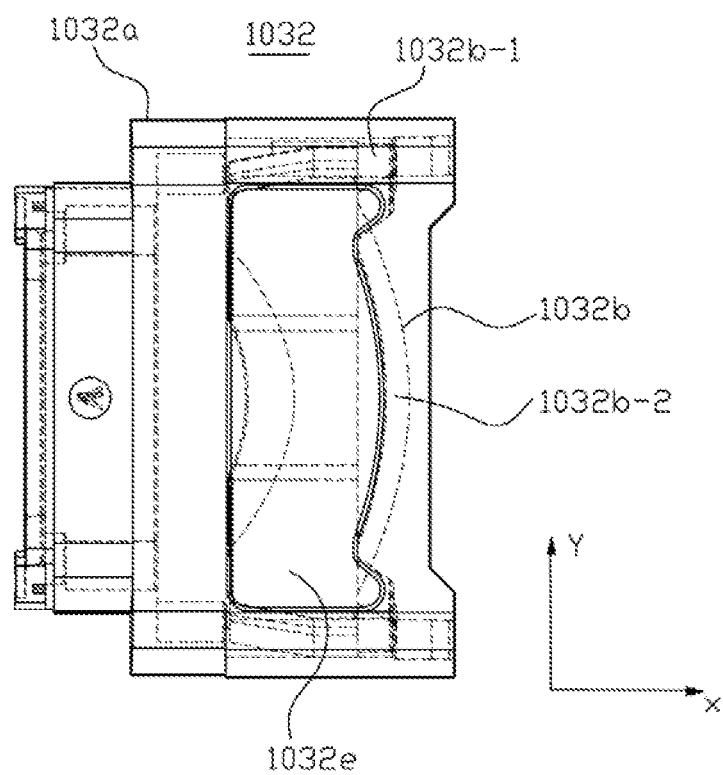
FIG. 9B is a top view of the second lens group in accordance with another embodiment of the invention.

FIG. 9A is a schematic view showing the structure of the second lens frame 1032a of the second lens group in accordance with another embodiment of the invention. FIG. 9B is a top view of the second lens group in accordance with another embodiment of the invention. Because this embodiment and the previous embodiment have same parts, the descriptions of the same parts are omitted.

As shown in FIGS. 9A and 9B, the second inner circumferential portion 1032a-2 of the adhesive-applying groove 1032g is similar to the second outer circumferential portion of the second lens 1032b in shape. The adhesive-applying groove 1032g is smaller than the second outer circumferential portion of the second lens 1032b. This embodiment differs from the previous embodiment in that the shape of the adhesive-applying groove 1032g is changed. In this embodiment, the adhesive-applying groove 1032g is not elongated. Rather, the shape of the adhesive-applying groove 1032g is similar to the outline of the outer circumferential surface of the second lens 1032b projected onto the second lens frame 1032a in the third direction Z, and the adhesive-applying groove 1032g is smaller than the second lens 1032b when observed in the third direction Z. The adhesive-applying groove 1032g includes an end portion 1032g-1 corresponding to the edge portion 1032b-1 of the second lens 1032b, and a curved portion 1032g-2 corresponding to the central effective-diameter portion 1032b-2 of the second lens 1032b.

In this embodiment, the term "similar" means "geometrically similar" in math. That is, the figures are the same but dimensions are different. However, the invention is not limited thereto. The shape of the adhesive-applying groove 1032g may be not similar to the outline of the outer circumferential surface of the second lens 1032b projected onto the second lens frame 1032a in the third direction Z. For example, the adhesive-applying groove 1032g may be rectangular, oval, or in other irregular shapes.

The second lens group 1032 may further include a reinforcing sheet (not shown) that fits the adhesive-applying groove 1032g. The reinforcing sheet is similar to the adhesive-applying groove 1032g in shape and may be slightly smaller than the adhesive-applying groove 1032g. The reinforcing sheet is fixed to the interior of the adhesive-applying groove 1032g by adhesive.

The second lens 1032b and the second lens frame 1032a may be integrally formed into one piece, especially when the second lens 1032b is made of plastic. This arrangement can effectively promote the strength of the second lens 1032b so that the second lens 1032b can maintain its performance, even during the test of reliability or under the conditions of high temperature and high humidity.

For a lens device provided with zooming function (e.g. smart phone, tablet computer and so on), the inner space is very limited. In order to increase the space utilization and reduce the thickness of the lens module, the lens barrel and a part of lenses are modified to be non-circular in design. That is, when observed along the optical axis in the first direction X, the upper and lower portions of a circle (a traditional lens barrel and lens are circular) are cut away to obtain a shape of athletic field, oak barrel, or the like (i.e. non-circular). Thus, when the non-circular lens (or lens barrel) is observed along the optical axis in the first direction X, the left side and the right side thereof are opposite in the second direction Y and are in shape of circular arc. Further, when the non-circular lens (or lens barrel) is observed along the optical axis in the first direction X, the upper side and the lower side thereof are opposite in the third direction Z and are parallel to each other (or are symmetrically arranged with respect to the optical axis). For example, the upper side and the lower side of the non-circular lens are straight lines, curved lines an so on. Thus, after the lens device is assembled, the forces and stresses applied to the upper and lower sides of the lens by the lens frame in the third direction Z can be reduced, and deformation of the lens due to the bias stresses to affect the image-forming quality when light passes therethrough can be avoided. In other words, less bias forces are applied to the lens, deformation of the lens can be avoided, and good image-forming quality can be obtained.

In this embodiment, the second lens group 1032 and the third lens group 1033 are movable along the optical axis in the first direction X. However, this is only an example taken for describing the invention and the invention is not limited thereto.

A guiding unit is disposed in the first direction X on the base 101. In this embodiment, the guiding unit includes a lens-group-guiding element 1041 and a guiding-and-positioning element 1042, which are disposed on both sides of the lens module 103 and are extended in the first direction X. The lens-group-guiding element 1041 is connected between the first side wall 1011 and the second side wall 1013 and is disposed close to one of the third side wall 1013 and the fourth side wall 1014. In the embodiment depicted by figures, the lens-group-guiding element 1041 is disposed close to the fourth side wall 1014. For easy descriptions, hereinafter the "one of the third side wall 1013 and the fourth side wall 1014" described above is represented by the fourth side wall 1014, and "the other of the third side wall 1013 and the fourth side wall 1014" described above is represented by the third side wall 1013.

Preferably, the lens-group-guiding element 1041 is connected between upper portions of the first side wall 1011 and the second side wall 1012 on the first side to provide a space for assembling other parts. In the embodiment depicted by the figures, the lens-group-guiding element 1041 is a guiding rod. However, the invention is not limited thereto. In the lens module 103, the second lens frame 1032a and the third lens frame 1033a of the second lens group 1032 and the third lens group 1033, movable along the optical axis, are respectively provided with holes 1032c, 1033c. The lens-group-guiding element 1041 fits the holes 1032c, 1033c to provide guiding function in the first direction X. Also, the first lens group 1031 and the fourth lens group 1034 are connected to the lens-group-guiding element 1041 through the holes 1031c, 1034c of the lens frames 1031a, 1034a. In some other embodiments, the first lens group 1031 and/or the fourth lens group 1034 may be movable along the lens-group-guiding element 1041 or may be fixed to the base 101. The number of the lens-group-guiding element 1041 may be more than one. In case the assembly space is sufficiently large, the number of the lens-group-guiding element 1041 can be plural, for example, two.

In the embodiment depicted by the figures, the guiding-and-positioning element 1042 is connected between the first side wall 1011 and the second side wall 1012 and is disposed close to the third side wall 1013. Specifically, the guiding-and-positioning element 1042 is connected between lower portions of the first side wall 1011 and the second side wall 1012 on the second side. The guiding-and-positioning element 1042 and the lens-group-guiding element 1041 are disposed on both sides of the lens module 103. The guiding-and-positioning element 1042 is a guiding rod. However, the invention is not limited thereto. In the lens module 103, the second lens frame 1032a and the third lens frame 1033a of the second lens group 1032 and the third lens group 1033, movable along the optical axis, are respectively provided with openings 1032d and 1033d. The guiding-and-positioning element 1042 fits the openings 1032d and 1033d to provide guiding function in the first direction X. Also, the first lens group 1031 and the fourth lens group 1034 are connected to the guiding-and-positioning element 1042 through the openings 1031d and 1034d of the first lens frames 1031a and the fourth lens frame 1034a.

In the embodiment depicted by the figures, the first, second, third and fourth lens frames 1031a, 1032a, 1033a, 1034a are respectively provided with extending portions 1031e, 1032e, 1033e, 1034e. The extending portions 1031e, 1032e, 1033e, 1034e extend toward the third side wall 1013. The openings 1031d, 1032d, 1033d, 1034d are respectively formed on the extending portions 1031e, 1032e, 1033e, 1034e.

Preferably, the openings 1032d, 1033d of the second lens frame 1032a and the third lens frame 1033a are open toward the third side wall 1013 in the second direction Y. In the embodiment depicted by the figures, the openings 1032d, 1033d are open toward the third side wall 1013. The openings 1031d, 1034d of the first lens frame 1031a and the fourth lens frame 1034a are open toward the bottom of the base 101 in the third direction Z. The first side wall 1011 and the second side wall 1012 of the base 101 are provided with openings which are open upward to support both ends of the guiding-and-positioning element 1042. By such arrangement, the guiding-and-positioning element 1042 is held in three directions and therefore the position thereof is stable. It is understood that the holes 1031c, 1032c, 1033c, 1034c of the first, second, third and fourth lens frames 1031a, 1032a, 1033a, 1034a can be also replaced with similar openings. Alternatively, a part of lens frames is provided with hole(s) while another part of lens frames is provided with opening(s).

The structure of the guiding-and-positioning element 1042 is not limited thereto. The guiding-and-positioning element 1042 may be an elongated protrusion disposed on the third side wall 1013 and extended in the first direction X, wherein the openings 1031d, 1032d, 1033d, 1034d of the first, second, third and fourth lens frames 1031a, 1032a, 1033a, 1034a are all open toward the third side wall 1013. Further, the guiding-and-positioning element 1042 may be a continuous elongated protrusion extended from the first side wall 1011 to the second side wall 1012. Alternatively, the guiding-and-positioning element 1042 may include a plurality of elongated protrusions which are spaced from each other. The traveling range of each lens group is limited without beyond the corresponding elongated protrusion.

The lens device 100 further includes a driving device and a position sensing device. The driving device is configured to drive movable lens groups to move in the first direction X. The position sensing device is electrically connected to the driving device. The driving device includes magnets fixed to the base 101, and coils fixed to the movable lens groups. The position sensing device includes position magnets 1061, 1062 fixed to the movable lens groups, and position sensors (not shown) fixed to the base 101. However, this is only an example taken for describing the invention and the invention is not limited thereto. It is understood that the magnets can be fixed to the movable lens groups while the coils are fixed to the base 101. In other words, the magnets are fixed to one of the base 101 and the movable lens group, and the coils are fixed to the other of the base 101 and the movable lens group.

In the embodiment depicted by the figures, a first magnet 1051 is fixed to the inner side of the base 101. A first coil 1052 corresponding to the first magnet 1051 is fixed to the circumferential side surface of the second lens group 1032. The first magnet 1051 is disposed on the fourth side wall 1014. The first magnet 1051 and the lens-group-guiding element 1041 are disposed on the same side of the fourth side wall 1014. The number of the first coil 1052 can be one or more. If a plurality of first coils 1052 are provided, then they can be placed at intervals or without intervals in the first direction X.

A second magnet 1053 is fixed to the inner side of the base 101. A second coil 1054 corresponding to the second magnet 1053 is fixed to the circumferential side surface of the third lens group 1023. The second magnet 1053 is disposed on the fourth side wall 1014. The second magnet 1053 and the lens-group-guiding element 1041 are disposed on the same side of the fourth side wall 1014. The number of the second coil 1054 can be one or more. If a plurality of second coils 1054 are provided, then they can be placed at intervals or without intervals in the first direction X.

A first flexible printed circuit board 1032f and a second flexible printed circuit board 1033f are fixed to the bottoms of the second lens frame 1032a and the third lens frame 1033a. The lens device 100 further includes a circuit board (not shown). First ends of the first flexible printed circuit board 1032f and the second flexible printed circuit board 1033f are electrically connected to the first coil 1052 and the second coil 1054, respectively. The first flexible printed circuit board 1032f and the second flexible printed circuit board 1033f are extended along the bottoms of the second lens frame 1032a and the third lens frame 1033a and are fixed thereto. Further, the first flexible printed circuit board 1032f and the second flexible printed circuit board 1033f are extended under the guiding-and-positioning element 1042 and out therefrom and are bent in the first direction X to form bent portions 1032f-1, 1033f-1. Second ends of the first flexible printed circuit board 1032f and the second flexible printed circuit board 1033f are electrically connected to the circuit board on the bottom of the base 101, respectively. However, this is only an example taken for describing the invention and the invention is not limited thereto. The first flexible printed circuit board 1032f and the second flexible printed circuit board 1033f may be changed to extend under the lens-group-guiding element 1041 and out therefrom, namely, from a place beside the fourth side wall 1014.

The guiding-and-positioning element 1042 is kept in contact with the tops of the bent portions 1032f-1, 1033f-1 of the first flexible printed circuit board 1032f and the second flexible printed circuit board 1033f. Therefore, during the movement of the second lens frame 1032a and the third lens frame 1033a, the guiding-and-positioning element 1042 can be always propped against the first flexible printed circuit board 1032f and the second flexible printed circuit board 1033f and guides them to move along with the second lens frame 1032a and the third lens frame 1033a, with the bent portions 1032f-1, 1033f-1 kept in the predetermined shape.

Preferably, the first flexible printed circuit board 1032f and the second flexible printed circuit board 1033f are respectively extended out of the bottoms of the extending portions 1032e, 1033e of the second lens frame 1032a and the third lens frame 1033a. Inclined surfaces are formed on the bottoms of the extending portions 1032e, 1033e and extended toward the guiding-and-positioning element 1042. The first flexible printed circuit board 1032f and the second flexible printed circuit board 1033f are extended along the inclined surfaces to be in contact with the guiding-and-positioning element 1042.

Figure 7:
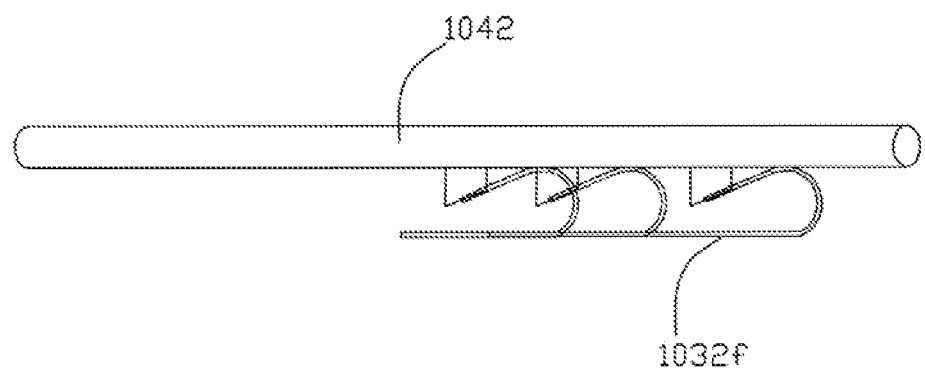
FIG. 7 is a schematic diagram showing the flexible printed circuit in different positions in accordance with the embodiment of the invention.

FIG. 7 is a schematic diagram showing the flexible printed circuit in different positions in accordance with the embodiment of the invention, wherein the first flexible printed circuit board 1032f is taken as an example for descriptions. It can be seen from FIG. 8 that the first flexible printed circuit 1032f in different positions always has its shape kept in a stable state when the second lens group 1032 is moved along the optical axis in the first direction X to perform zooming operation. Further, where the first flexible printed circuit 1032f is bent is well under control.

As compared to the prior art, the invention can keep the shape of the flexible printed circuit in a stable state and improve the bending resistance of the flexible printed circuit board.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A lens device, comprising:
   a base;
   a guiding unit disposed on the base in a first direction;
   a plurality of lens groups disposed on the base and comprising at least one movable lens group that is movable along the guiding unit;
   a flexible printed circuit board fixed to the movable lens groups, and bent in the first direction to form a bent portion;
   wherein the guiding unit is disposed in contact with a top of the bent portion of the flexible printed circuit board;
   wherein the movable lens group comprises a lens frame and a lens fixed to the lens frame;
   wherein the lens frame comprises an extending portion which comprises a bottom and an inclined surface formed on the bottom;
   wherein the flexible printed circuit board is extended out of the bottom of the extending portion, along the inclined surface, and in contact with the guiding unit.

2. The lens device as claimed in claim 1, wherein the flexible printed circuit board is extended out of the movable lens group.

3. The lens device as claimed in claim 1, wherein the guiding unit comprises a guiding-and-positioning element disposed in contact with the top of the bent portion of the flexible printed circuit board.

4. The lens device as claimed in claim 3, wherein the guiding unit further comprising a lens-group-guiding element, and the lens-group-guiding element and the guiding-and-positioning element are disposed on both sides of the movable lens group.

5. The lens device as claimed in claim 1, wherein the extending portion comprises an opening or a hole which the guiding unit fits.

6. The lens device as claimed in claim 5, wherein the inclined surface is extended toward the guiding unit.

7. The lens device as claimed in claim 1, further comprising a driving device configured to drive the movable lens group to move in the first direction.

8. The lens device as claimed in claim 7, wherein the driving device comprises a magnet fixed to the base, and a coil fixed to the movable lens group.

9. The lens device as claimed in claim 8, further comprising a circuit board disposed on a bottom of the base;
   wherein the flexible printed circuit board comprises a first end electrically connected to the coil;
   wherein the flexible printed circuit board is extended along a bottom of the movable lens group and is fixed thereto;
   wherein the flexible printed circuit board is further extended under the guiding unit and out therefrom to form the bent portion;
   wherein the flexible printed circuit board further comprises a second end electrically connected to the circuit board.

10. The lens device as claimed in claim 7, wherein the driving device comprises a magnet fixed to the movable lens group, and a coil fixed to the base.

11. The lens device as claimed in claim 10, further comprising a circuit board disposed on a bottom of the base;
    wherein the flexible printed circuit board comprises a first end electrically connected to the coil;
    wherein the flexible printed circuit board is extended along a bottom of the movable lens group and is fixed thereto;
    wherein the flexible printed circuit board is further extended under the guiding unit and out therefrom to form the bent portion;
    wherein the flexible printed circuit board further comprises a second end electrically connected to the circuit board.

12. The lens device as claimed in claim 1, wherein:
    the base comprises a first side wall, a second side wall, a third side wall and a fourth side wall;
    the first side wall and the second side wall are disposed opposite to each other and perpendicular to the first direction;
    the third side wall and the fourth side wall are disposed opposite to each other and perpendicular to a second direction;
    the second direction is perpendicular to the first direction;
    the guiding unit comprising a guiding-and-positioning element disposed in contact with the top of the bent portion of the flexible printed circuit board.

13. The lens device as claimed in claim 12, wherein the guiding-and-positioning element is a guiding rod connected between the first side wall and the second side wall.

14. The lens device as claimed in claim 12, wherein the guiding-and-positioning element is an elongated protrusion disposed on the third side wall or the fourth side wall.

15. The lens device as claimed in claim 1, wherein:
    the lens comprises an outer circumferential surface;
    the outer circumferential surface comprises first outer circumferential portions disposed opposite to each other in a second direction, and second outer circumferential portions are connected between the first outer circumferential portions and disposed opposite to each other in a third direction;
    the first, second and third directions are perpendicular to each other;
    the second outer circumferential portions are in parallel.

16. The lens device as claimed in claim 15, wherein the lens frame comprises an adhesive-applying groove, and the adhesive-applying groove is penetrated through the lens frame and corresponds to the second outer circumferential portions of the lens.

17. The lens device as claimed in claim 16, wherein:
    the first outer circumferential portions are curved;
    the lens further comprises an edge portion and a central effective-diameter portion;
    the adhesive-applying groove comprises an end portion corresponding to the edge portion of the lens, and a curved portion corresponding to the central effective-diameter portion of the lens.

18. The lens device as claimed in claim 17, wherein the adhesive-applying groove is elongated.

19. A lens device comprising:
    a base;
    a guiding unit disposed on the base in a first direction;
    a plurality of lens groups disposed on the base and comprising at least one movable lens group that is movable along the guiding unit;
    a flexible printed circuit board fixed to the movable lens groups, and bent in the first direction to form a bent portion;
    wherein the guiding unit is disposed in contact with a top of the bent portion of the flexible printed circuit board;
    wherein the plurality of lens groups further comprises a lens frame and a lens disposed in the lens frame;
    wherein the lens comprises an outer circumferential surface;

wherein the outer circumferential surface comprises second outer circumferential portions which are disposed opposite to each other in a third direction;

wherein the lens frame comprises an adhesive-applying groove;

wherein a shape of the adhesive-applying groove is similar to an outline of the outer circumferential surface of the lens projected onto the lens frame in the third direction;

wherein the adhesive-applying groove is smaller than the lens when observed in the third direction;

wherein at least one of the plurality of lens groups further comprises a reinforcing sheet that fits the adhesive-applying groove.

* * * * *